US005972185A

United States Patent [19]
Hendricks et al.

[11] Patent Number: 5,972,185
[45] Date of Patent: Oct. 26, 1999

[54] CATHODIC ARC VAPOR DEPOSITION APPARATUS (ANNULAR CATHODE)

[75] Inventors: Robert E. Hendricks, Port Saint Lucie; Russell A. Beers, Palm Beach Gardens, both of Fla.; Dean N. Marszal, Southington, Conn.; Allan A. Noetzel, Singer Island, Fla.; Robert J. Wright, Charlestown, W. Va.

[73] Assignee: United Technologies Corporation, Hartford, Conn.

[21] Appl. No.: 08/919,131

[22] Filed: Aug. 30, 1997

[51] Int. Cl.$^6$ .................................................... C23C 14/32
[52] U.S. Cl. ................................ 204/298.41; 204/192.38
[58] Field of Search .......................... 204/192.38, 298.41, 204/298.21

[56] References Cited

U.S. PATENT DOCUMENTS

| | | | |
|---|---|---|---|
| 3,625,848 | 12/1971 | Snaper | 204/192 |
| 3,783,231 | 1/1974 | Sablev et al. | 219/123 |
| 3,793,179 | 2/1974 | Sablev et al. | 204/298 |
| 3,836,451 | 9/1974 | Snaper | 204/298 |
| 4,492,845 | 1/1985 | Kljuchko et al. | 219/121 P |
| 4,609,564 | 9/1986 | Pinkhasov | 427/37 |
| 4,673,477 | 6/1987 | Ramalingam et al. | 204/192.38 |
| 4,724,058 | 2/1988 | Morrison, Jr. | 204/192.38 |
| 4,849,088 | 7/1989 | Veltrop et al. | 204/298.41 |
| 4,859,489 | 8/1989 | Pinkhasov | 427/37 |
| 4,869,203 | 9/1989 | Pinkhasov | 118/723 |
| 4,904,362 | 2/1990 | Gaertner et al. | 204/298.21 |
| 4,924,135 | 5/1990 | Pinkhasov | 313/326 |
| 4,929,321 | 5/1990 | Buhl | 204/192.38 |
| 4,942,844 | 7/1990 | Pinkhasov | 118/723 |
| 4,978,556 | 12/1990 | Pinkhasov | 427/37 |
| 5,011,638 | 4/1991 | Pinkhasov | 264/59 |
| 5,026,466 | 6/1991 | Wesemeyer et al. | 204/298.41 |
| 5,037,522 | 8/1991 | Vergason | 204/298.41 |
| 5,045,344 | 9/1991 | Pinkhasov | 427/37 |
| 5,126,030 | 6/1992 | Tamagaki et al. | 204/192.38 |
| 5,221,349 | 6/1993 | Tamagaki | 118/708 |
| 5,234,561 | 8/1993 | Randhawa et al. | 204/192.38 |
| 5,269,896 | 12/1993 | Munemasa et al. | 204/192.38 |
| 5,269,898 | 12/1993 | Welty | 204/298.41 |
| 5,279,723 | 1/1994 | Falabella et al. | 204/192.38 |
| 5,282,944 | 2/1994 | Sanders et al. | 204/192.38 |
| 5,306,408 | 4/1994 | Treglio | 204/192.38 |
| 5,317,235 | 5/1994 | Treglio | 315/111.41 |
| 5,363,400 | 11/1994 | Damond et al. | 204/298.41 |
| 5,380,420 | 1/1995 | Tsuji | 204/298.41 |
| 5,441,624 | 8/1995 | Chan et al. | 204/298.41 |
| 5,458,754 | 10/1995 | Sathrum et al. | 204/192.38 |
| 5,468,363 | 11/1995 | Falabella | 204/298.41 |
| 5,480,527 | 1/1996 | Welty | 204/192.38 |
| 5,518,597 | 5/1996 | Storer et al. | 204/192.38 |
| 5,580,669 | 12/1996 | Beers et al. | 428/660 |
| 5,588,975 | 12/1996 | Hammond et al. | 51/293 |
| 5,730,847 | 3/1998 | Hanaguri et al. | 204/298.41 |

OTHER PUBLICATIONS

Randhawa, H. and Johnson, P. C. "Technical Note: A Review of Cathodic Arc Plasma Deposition Processes and Their Applications." *Surface and Coatings Technology*, 31 (1987), pp. 303–318. Elsevier Sequoia.

"Sputtering—A Vacuum Deposition Method for Coating Material", T. S palvins, Lewis Research Center, Cleveland, Ohio, 1972, N72–24529, 20 pages, Technical Paper proposed for presentation at Design Engineering Conference sponsored by the Design Engineering Division of the American Society of Mechanical Engineers, Chicago, Illinois, May 8–11, 1972.

*Primary Examiner*—Nam Nguyen
*Assistant Examiner*—Rodney G. McDonald
*Attorney, Agent, or Firm*—Richard D. Getz

[57] ABSTRACT

According to the present invention, an apparatus for applying material by cathodic arc vapor deposition to a substrate is provided which includes a vessel, apparatus for maintaining a vacuum in the vessel, an annular cathode having a bore and an evaporative surface extending between first and second end surfaces, apparatus for selectively sustaining an arc of electrical energy between the cathode and an anode, and apparatus for steering the arc around the evaporative surface. The apparatus for steering the arc is positioned within the cathode bore, and produces a magnetic field that runs substantially parallel to the evaporative surface. The annular cathode is disposed radially inside of, and aligned with, the substrates inside the vessel.

4 Claims, 3 Drawing Sheets

CATHODIC ARC VAPOR DEPOSITION APPARATUS (ANNULAR CATHODE)

BACKGROUND OF THE INVENTION

1. Technical Field

This invention relates to vapor deposition apparatus in general, and to cathodic arc vapor deposition apparatus in particular.

2. Background Information

Vapor deposition as a means for applying a coating to a substrate is a known art that includes processes such as chemical vapor deposition, physical vapor deposition, and cathodic arc vapor deposition. Chemical vapor deposition involves introducing reactive gaseous elements into a deposition chamber containing one or more substrates to be coated. Physical vapor deposition involves providing a source material and a substrate to be coated in a evacuated deposition chamber. The source material is converted into vapor by an energy input, such as heating by resistive, inductive, or electron beam means.

Cathodic arc vapor deposition involves a source material and a substrate to be coated placed in an evacuated deposition chamber. The chamber contains only a relatively small amount of gas. The negative lead of a direct current (DC) power supply is attached to the source material (hereinafter referred to as the "cathode") and the positive lead is attached to an anodic member. In many cases, the positive lead is attached to the deposition chamber, thereby making the chamber the anode. A arc-initiating trigger, at or near the same potential as the anode, contacts the cathode and subsequently moves away from the cathode. When the trigger is still in close proximity to the cathode, the difference in potential between the trigger and the cathode causes an arc of electricity to extend therebetween. As the trigger moves further away, the arc jumps between the cathode and the anodic chamber. The exact point, or points, where an arc touches the surface of the cathode is referred to as a cathode spot. Absent a steering mechanism, a cathode spot will move randomly about the surface of the cathode.

The energy deposited by the arc at a cathode spot is intense; on the order of $10^5$ to $10^7$ amperes per square centimeter with a duration of a few to several microseconds. The intensity of the energy raises the local temperature of the cathode spot to approximately equal that of the boiling point of the cathode material (at the evacuated chamber pressure). As a result, cathode material at the cathode spot vaporizes into a plasma containing atoms, molecules, ions, electrons, and particles. Positively charged ions liberated from the cathode are attracted toward any object within the deposition chamber having a negative electric potential relative to the positively charged ion. Some deposition processes maintain the substrate to be coated at the same electric potential as the anode. Other processes use a biasing source to lower the potential of the substrate and thereby make the substrate relatively more attractive to the positively charged ions. In either case, the substrate becomes coated with the vaporized material liberated from the cathode. The rate of deposition, the coating density, and thickness can be adjusted to satisfy the needs of the application.

The random movement of the arc can sometimes lead to non-uniform erosion of the cathode, which in turn can limit the useful life of the cathode. To avoid non-uniform erosion, it is known to steer or drive the arc relative to the cathode. U.S. Pat. Nos. 4,673,477, 4,849,088, and 5,037,522 are examples of patents that disclose apparatus for steering an arc relative to a cathode. Some prior art steers the arc by mechanically manipulating a magnetic field source relative to the cathode. Other prior art steers the arc by electrically manipulating the magnetic field source relative to the cathode. In both these approaches, the speed of the arc relative to the cathode is limited by the speed of the apparatus mechanically or electrically manipulating the magnetic field source. Another limitation of these approaches is the complexity of the hardware or switching mechanisms necessary to manipulate the magnetic field source relative to the cathode. A person of skill in the art will recognize that a production coating environment is harsh and simplicity generally equates with reliability.

Many prior art cathodic arc coaters are not designed for efficient, cost effective high volume use. In the example above, where complex switching mechanisms and hardware are used to manipulate magnetic field sources, cathode replacement can be cumbersome and time consuming, and consequently costly. The same cost-problem exists in most cathodic arc coaters that directly cool the cathode. Direct cooling is generally accomplished by passing coolant between the cathode and a manifold attached to the cathode, or by piping coolant directly through the cathode. Either way, the cathode must be machined to accept the manifold or piping, and the cost of the consumable cathode is consequently increased (often dramatically). In addition, some desirable cathode materials are not readily machinable. Another problem with directly cooling the cathode is the labor required to replace the cathode when its useful life has expired. In the previous example where a manifold (or piping) is mechanically attached to the cathode, the hardware (or piping) must be detached from the old cathode and attached to a new one, and the deposition chamber subsequently cleaned of coolant. For those applications which require cathode replacement after each coating run, the cost of the cathode and the labor to replace it can be considerable.

In short, what is needed is an apparatus for cathodic arc vapor deposition of material on a substrate that operates efficiently, one capable of consistently providing a high quality coatings on a substrate, and one that operates cost effectively.

DISCLOSURE OF THE INVENTION

It is, therefore, an object of the present invention to provide an apparatus for cathodic arc vapor deposition of material on a substrate that operates in a cost effective manner.

It is another object of the present invention to provide an apparatus for cathodic arc vapor deposition of material on a substrate that consistently provides a high quality coating on a substrate.

According to the present invention, an apparatus for applying material by cathodic arc vapor deposition to a substrate is provided which includes a vessel, means for maintaining a vacuum in the vessel, an annular cathode having a bore and an evaporative surface extending between first and second end surfaces, means for selectively sustaining an arc of electrical energy between the cathode and an anode, and means for steering the arc around the evaporative surface. The means for steering the arc is positioned within the cathode bore, and produces a magnetic field that runs substantially parallel to the evaporative surface. The annular cathode is disposed radially inside of, and aligned with, the substrates inside the vessel.

An advantage of the present invention is that the present invention apparatus for cathodic arc vapor deposition of material on a substrate is designed to operate in a cost effective manner. One cost effective characteristic of the present invention is the cathode. The present invention cathode is annular and can be cut, for example, from a cylindrical casting and drilled. The simply formed cathode requires minimal expensive machining, thereby reducing the cost of the cathode and the overall coating process. Another cost effective characteristic is that the cathode is readily inserted in the vessel. Some prior art cathodic arc coaters have cathodes that are fastened in place with the deposition chamber, and/or have attached cooling apparatus. In either case, the labor to install and remove the cathode undesirably increases the cost of the coating process. Another cost effective characteristic of the present invention is that the form of the used cathode facilitates recycling. The used cathode is made of high quality material that has been exposed to few, if any, contaminants. Consequently, the cathodes have considerable scrap value that reduces the cost of the coating process.

Another advantage of the present invention is that the magnetic field source, and the positioning of the magnetic field source within the cathode, help increase the efficiency of the coating process by maximizing the amount of material that can be eroded from a particular cathode.

Another advantage of the present invention is the simplicity and reliability of the means for steering the arc around the evaporative surface of the cathode. The means for steering the arc includes a magnetic field generator that does not require a switching mechanism. The absence of a switching mechanism increases the reliability of the steering means.

These and other objects, features and advantages of the present invention will become apparent in light of the detailed description of the best mode embodiment thereof, as illustrated in the accompanying drawings.

BEST MODE FOR CARRYING OUT THE INVENTION

I. Apparatus

Figure 1:
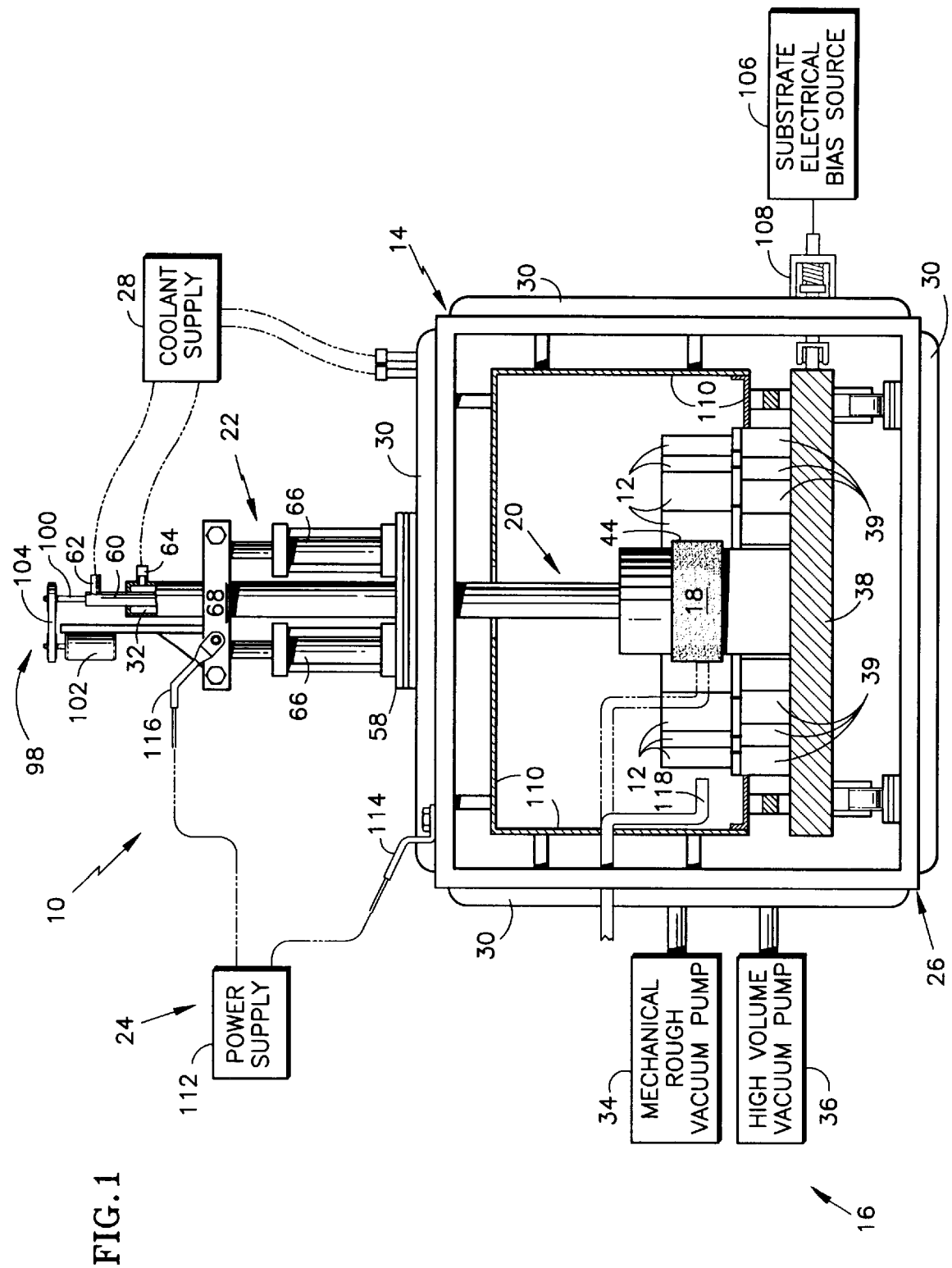
FIG. 1 is a diagrammatic view of the present invention cathodic arc vapor deposition apparatus.

Referring to FIG. 1, an apparatus 10 for cathodic arc vapor deposition on a substrate 12, hereinafter referred to as a "cathodic arc coater", is provided having a vessel 14, means 16 for maintaining a vacuum in the vessel 14, a cathode 18, a contactor 20, an actuator 22 for selectively actuating the contactor 20 into electrical contact with the cathode 18, means 24 for sustaining an arc of electrical energy between the cathode 18 and an anode 26, and means 27 for steering the arc (around the evaporative surface 44 as will be discussed below). A coolant supply 28 maintains the apparatus 10 within acceptable temperatures by cycling coolant through cooling passages 30,32 within the vessel 14 and contactor 20. The means 16 for maintaining a vacuum in the vessel 14 preferably includes a mechanical rough vacuum pump 34 and a high volume diffusion-type vacuum pump 36 piped to the interior of the vessel 14. Other vacuum means may be used alternatively, however. In the preferred embodiment, the cathode 18 is positioned on a platter 38 which can be readily inserted and removed from the vessel 14. The cathode 18 is mounted in the center of the platter 38, and is electrically insulated from the platter 38. A plurality of pivotly attached substrate pedestals 39, attached to the platter 38, surround the cathode 18.

Figure 2:
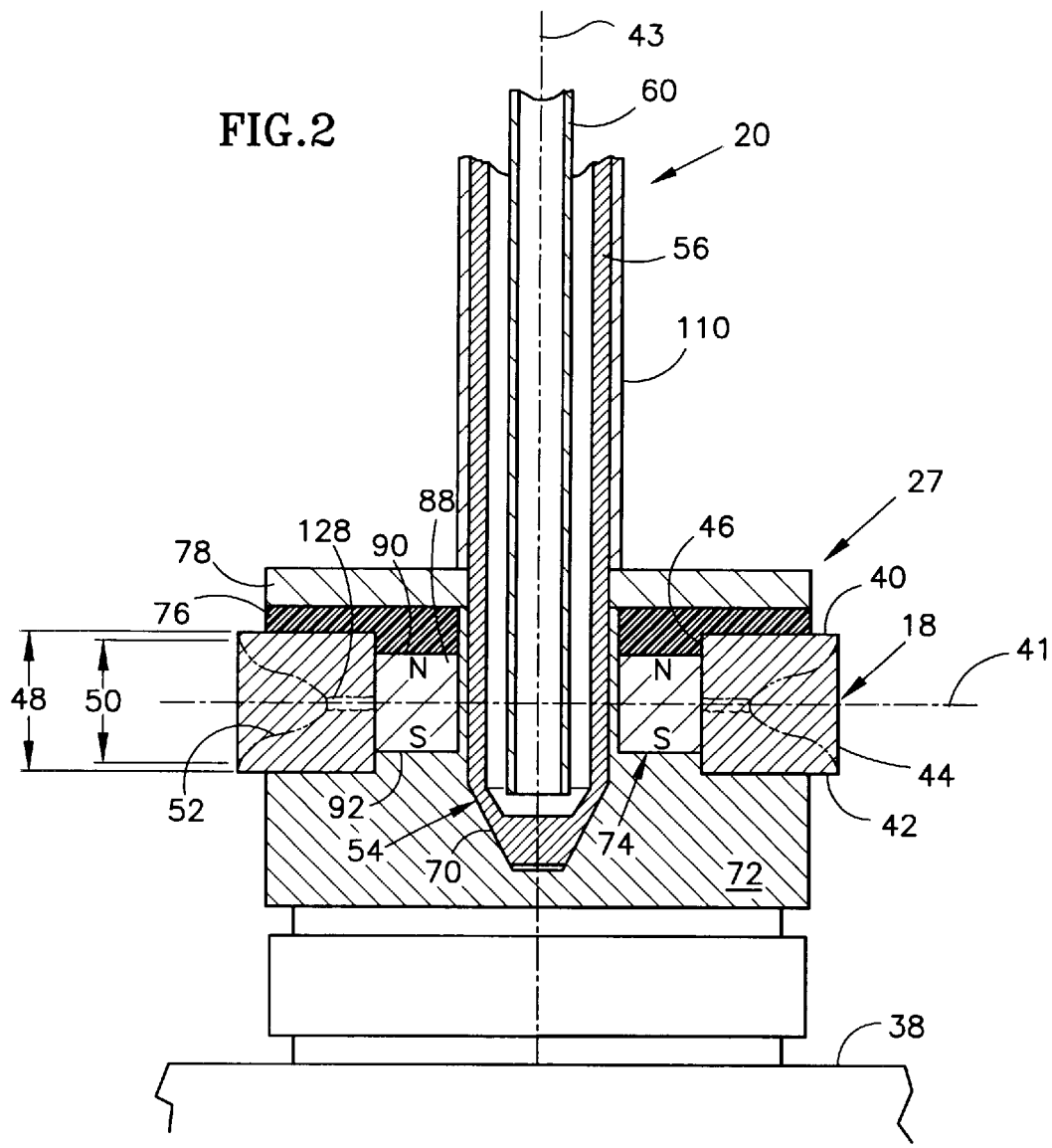
FIG. 2 is a diagrammatic partially sectioned view of an embodiment of the contactor.
Figure 4:
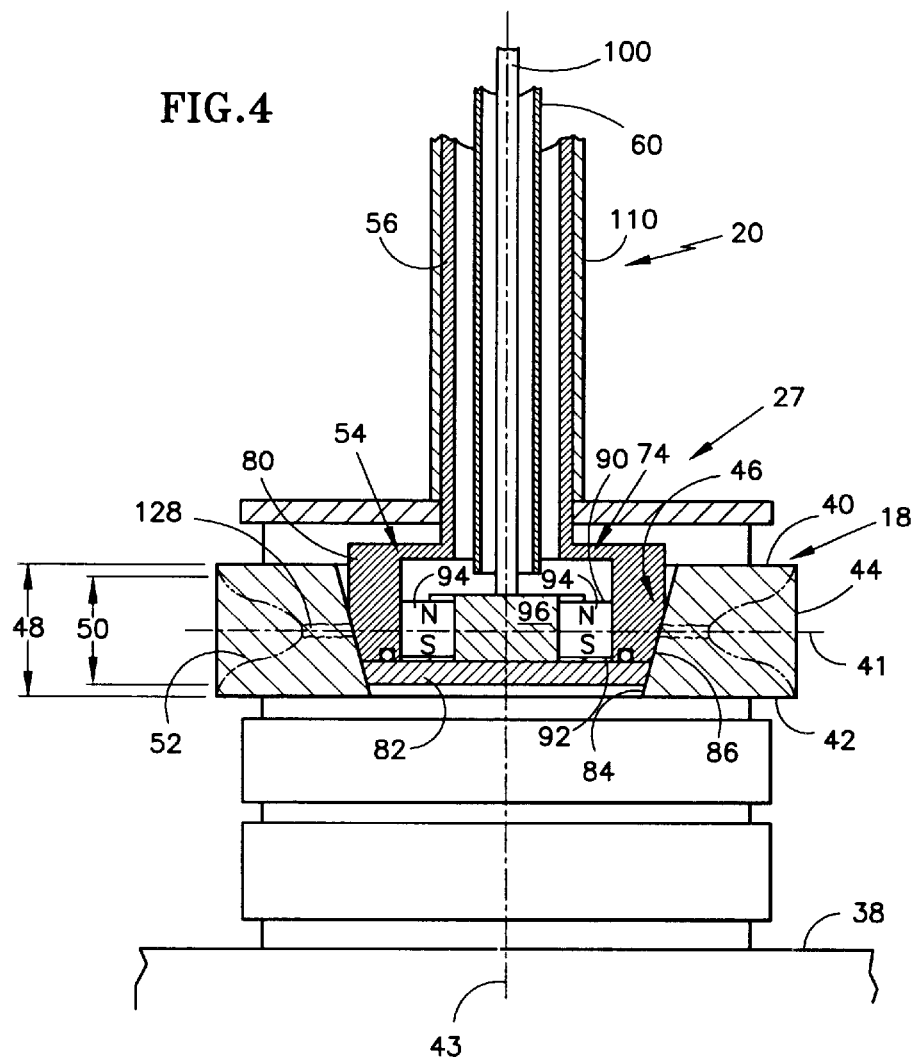
FIG. 4 is a diagrammatic partially sectioned view of another embodiment of the contactor.

Referring to FIGS. 2 and 4, the cathode 18 is substantially annular, having a first end surface 40, a second end surface 42, and an evaporative surface 44 and bore 46 extending between the first 40 and second 42 end surfaces. The end surfaces 40,42 are substantially parallel with one another. A line 41, extending radially outward from the centerline 43 of the cathode 18, positioned on or substantially near the axial midpoint of the cathode 18, represents the axial midpoint of the cathode 18. The material composition of the cathode 18 will depend upon the material to be deposited. The axial length 48 of the cathode 18 is preferably longer than the anticipated final axial length 50 of the erosion pattern 52 along the evaporative surface 44 of the cathode 18. Keeping the erosion pattern 52 between the end surfaces 40,42 minimizes the possibility that the arc will leave the evaporative surface 44 of the cathode 18.

Referring to FIGS. 1,2, and 4, the contactor 20 includes a head 54 attached to a hollow shaft 56. The head is positioned inside the vessel 14 and the shaft 56 extends from the head 54 to outside the vessel 14. An insulative disk 58 electrically insulates the contactor 20 from the vessel 14. The contactor 20 preferably includes a cooling tube 60 coaxially positioned within the shaft 56, a coolant inlet port 62 connected to the cooling tube 60, and a coolant exit port 64 connected to the passage 32 formed between the coaxial coolant tube 60 and shaft 56. The coaxial arrangement between the cooling tube 60 and the shaft 56 allows coolant to flow in the cooling tube 60 and exit via the passage 32 between the shaft 56 and the cooling tube 60, or vice versa. The actuator 22 for selectively actuating the contactor 20 into electrical contact with the cathode 18 includes a pair of two-way actuating cylinders 66 (hydraulic or pneumatic) acting between the vessel and a shaft flange attached to the contactor shaft. Mechanical apparatus (not shown) may be used in place of the actuating cylinders 66. A commercially available controller (not shown) can be used to control the position and force of the cylinders 66 (or mechanical apparatus).

Referring to FIG. 2, in a first embodiment the contactor head 54 includes a tapered end 70. The tapered end 70 is selectively received by a support block 72 that supports both the means 27 for steering the arc around the evaporative surface 44 and the cathode 18. The means 27 for steering the arc includes a magnetic field generator 74. The actuator 22 selectively actuates the contactor head 54 into and out of contact with the support block 72. The magnetic field generator 74 is positioned within the bore 46 of the cathode 18, substantially aligned with the axial midpoint 41 of the cathode 18. The support block 72 electrically connects the contactor 20 to the cathode 18. An electrical insulator 76 and deflector shield 78 positioned on the side of the cathode 18 opposite the support block 72, help keep contamination and debris off the cathode end surface 40.

Referring to FIG. 4, in a second embodiment the contactor head 54 includes a cup 80 and a lid 82 that houses the magnetic field generator 74. The cup 80 is received within the bore 46 of the cathode 18, such that the magnetic field generator 74 is substantially aligned with the axial midpoint 41 of the cathode 18. The cup 80 makes electrical contact with the cathode 18, thereby connecting the cathode 18 to the contactor 20. The actuator 22 selectively actuates the contactor head 54 into and out of contact with the cathode 18. FIG. 4 shows mating male 84 and female 86 surfaces on the cup 80 and within the cathode bore 46, respectively. The mating male 84 and female 86 connection facilitates the contact necessary for an adequate electrical contact. Other connection geometries may be used alternatively. In both embodiments, the contactor shaft 56 and head 54 are fabricated from an electrically conductive material such as a copper alloy.

Figure 5:
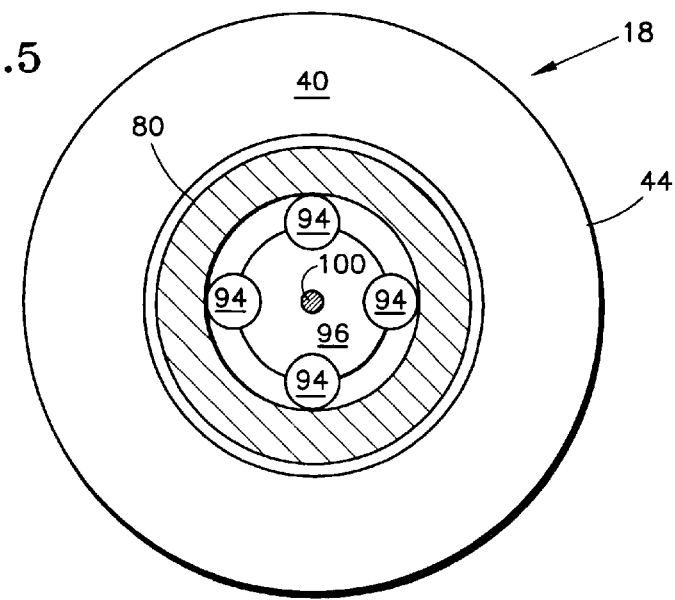
FIG. 5 is a diagrammatic top view of a magnetic field generator.

The magnetic field generator 74 includes an annular magnet 88, preferably segmented, which has a first 90 and second 92 end surface. The polar ends of the annular magnet 88 are aligned with the end surfaces 90,92; i.e., one end surface has an "N" polarity and the other has an "S" polarity. In an alternative embodiment, the magnetic field generator 74 includes a plurality of magnets 94 and a holder 96. The magnets 94 are held by the holder 96, and are uniformly spaced around the circumference of the cathode bore 46. Readily available commercial cylindrical magnets may be used. FIG. 5 shows an embodiment having four (4) magnets 94 held within the holder 96, although, the number of magnets 94 can be varied to accommodate the process at hand.

Referring to FIG. 1, the preferred embodiment further includes apparatus 98 for rotating the magnetic field generator 74. The rotation apparatus 98 includes a rod 100 extending through the coolant tube 60 and into the head 54 where it connects with the magnet holder 96. The opposite end of the rod 100 is connected to a variable speed drive motor 102 via a drive belt 104.

The cathodic arc coater 10 preferably includes a biasing source 106 for electrically biasing the substrates 12. A contact 108 electrically connects the biasing source 106 and the platter 38. The substrates 12, which are mechanically and electrically attached to the platter 38, are consequently electrically connected to the biasing source 106. Other means for electrically connecting the substrates 12 to the biasing source 106 may be used alternatively.

Deflector shields 110 are used throughout the cathodic arc coater 10 to confine the vaporized cathode materials in the area of the substrates 12. The deflector shields 110 attached to the vessel 14, platter 38, and the contactor 20 also minimize undesirable material build-up on those surfaces. In the preferred embodiment, the deflector shields 110 attached to the vessel 14 are electrically connected to the vessel 14 and are made of an electrically conductive material resistant to corrosion, such as stainless steel.

The means 24 for sustaining an arc of electrical energy between the cathode 18 and an anode 26 includes a direct current (D.C.) power supply 112. In the preferred embodiment, the positive lead 114 of the power supply 112 is connected to the vessel 14, thereby making the vessel 14 act as an anode. The negative lead 116 of the power supply 112 is electrically connected to the contactor shaft 56. Alternative embodiments may use an anode (not shown) disposed inside the vessel 14. An arc initiator 118 located inside the vessel 14 is maintained at or near the electrical potential of the vessel 14. The arc initiator 118 can be moved into and out of contact with the cathode 18.

II. Operation of the Apparatus

Referring to FIG. 1, in the operation of the present invention cathodic arc coater 10, a cathode 18 is attached to the center of the platter 38 and a substrate 12 is attached to each rotatable pedestal 39 surrounding the cathode 18. The platter 38 is subsequently loaded into the vessel 14. The substrates 12 have been previously degreased and substantially cleaned, although each will likely have some molecular contaminant and oxidation remaining on its exterior surface. The actuating cylinders 66 subsequently actuate the contactor 20 into electrical contact with the cathode 18 and the vessel 14 is closed. The mechanical rough vacuum pump 34 is operated to evacuate the vessel 14 to a predetermined pressure. Once that pressure is reached, the high volume diffusion vacuum pump 36 further evacuates the vessel 14 to near vacuum conditions. The substrates 12 are then cleaned of any remaining contaminants and/or oxidation by a method such as "sputter cleaning". Sputter cleaning is a process well known in the art and will not be described in detail here. Other cleaning methods may be used alternatively. After the substrates 12 are cleaned, the contaminants are purged typically using an inert gas.

Prior to initiating an arc several steps are completed, including: (1) the substrates 12 are set to a particular bias via the biasing source 106, making them electrically attractive to positive ions emitted from the cathode 18; (2) the substrates 12 are put in motion at a particular rotational velocity; (3) the power supply 112 is set to establish an arc having a particular magnitude of current and voltage, but no arc is initiated; (4) the vacuum pumps 34,36 establish and maintain a particular vacuum pressure of gas within the vessel 14; and (5) coolant is cycled through the cooling passages 30,32 within the vessel 14 and contactor 20. Specific process parameters will depend upon factors such as the substrate material, the material to be coated, and the desired characteristics of the coating, etc.

Once the aforementioned steps have been completed, the arc initiator 118 is brought into and out of contact with the evaporative surface 44 of the cathode 18, causing an arc to jump between the arc initiator 118 and the evaporative surface 44. The arc initiator 118 is subsequently moved a distance away from the cathode 18, preferably radially outside of the substrates 12. Once the arc initiator 118 is no longer proximate the cathode 18, the arc jumps between the cathode 18 and the deflector shields 110 electrically connected to the anodic vessel 14 (or directly to the anodic vessel 14).

Figure 3:
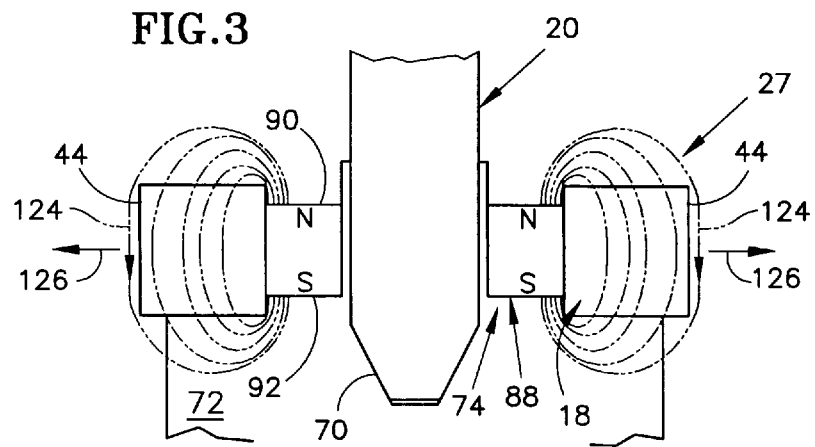
FIG. 3 is a diagrammatic partially sectioned view of the contactor shown in FIG. 2, including magnetic field lines emanating from the magnetic field generator.

Referring to FIGS. 2–4, the magnetic field generator 74 positioned in the contactor 20 drives the arc along the evaporative surface 44 of the cathode 18. The annular magnet 88 (or magnets 94) produces a magnetic field, a portion of which runs substantially parallel to the cathode evaporate surface 44. FIG. 3 shows an approximation of where the magnetic field lines are believed to run. A vector 124 representing the magnetic field extends between cathode end surfaces 40,42. The direction of the magnetic field vector depends upon the orientation of the magnet poles. In the case of multiple magnets 94, all magnet poles are oriented in like manner. A vector 126 representing the electric arc, in contrast, extends away from the evaporative surface 44 in a substantially perpendicular direction. Together, the magnetic field and the electric current of the arc create a force (the Hall effect) on the arc that steers the arc a distance around the circumference of the cathode 18. The dwell time of the arc at any particular cathode spot is inversely related to the Hall effect force; i.e., an increase in the Hall effect force, causes a decrease in the dwell time. In the embodiment utilizing an annular magnet 88, the continuous annular magnetic field and the current drive the arc along an arc path 128 circling the evaporative surface 44 of the cathode 18. In the multiple magnet 94 embodiments where the magnets 94 are in close circumferential proximity to one another, the individual magnetic fields collectively steers the arc along the arc path 128. The number of magnets 94, the relative spacing of magnetic fields emanating from magnets 94, and the intensity of those magnetic fields can be adjusted to satisfy the application at hand.

The symmetry of the magnetic field generator 74 relative to the cathode helps increase the efficiency of the coating process by maximizing the amount of material that can be eroded from a particular cathode. Specifically, substantially aligning the magnetic field generator 74 on the axial midpoint 41 of the cathode helps promote an arc path 128 proximate the axial midpoint 41 of the cathode 18. In addition, the symmetry of the magnetic field generator 74 relative to the cathode 18 also appears to increase the parallelism of the magnetic field lines relative to the cathode evaporative surface 44. Magnetic field lines that extend a substantial distance along the evaporative surface 44, parallel to the evaporative surface 44, appear to allow the arc to symmetrically travel on both sides of the "average" arc path 128 position. As a result, the erosion pattern 52 grows axially during the erosion process, thereby maximizing the amount of cathode material that can be eroded from a particular annular cathode 18 and consequently increasing the efficiency of the coating process.

FIGS. 2 and 4 shows an eroded cathode 18 in phantom, substantially symmetrical about an arc path 128. In the embodiment which includes the apparatus 98 for rotating the magnetic field generator 74 (see FIGS. 1 and 4), rotation of the magnetic field generator 74 within the contactor 20 helps promote uniform axial and circumferential erosion of the cathode 18. The rotation distributes the magnetic contribution of each magnet 94 around the circumference of the cathode 18 as a function of time. It must be emphasized, however, that rotation of the magnetic field generator 74 is not required to create a circling arc. As stated above, the magnetic field of the annular magnet 88 (or individual magnetic fields of the magnets 94 collectively) forces the arc to circle the cathode evaporative surface 44.

Referring to FIG. 1, the energy delivered by the arc causes the material at the cathode spot to vaporize, thereby liberating atoms, molecules, ions, electrons, and particles from the cathode 18. The biased substrates 12 attract the ions, causing them to accelerate toward the substrates 12. The ions strike the exterior surface of the substrates 12, attach, and collectively form a coating of the cathode material. When a coating of sufficient thickness has been deposited on the substrates 12, the power supply 112 is turned off and the arc extinguished. The vessel 14 is purged with inert gas and brought to ambient pressure. The contactor 20 is actuated out of contact with the cathode 18 and the platter 38 is removed from the vessel 14. The substrates 12 are subsequently removed from the platter 38 and new substrates 12 attached. The loaded platter 38 is then inserted back into the vessel 14 in the manner described earlier and the process repeated.

Although this invention has been shown and described with respect to the detailed embodiments thereof, it will be understood by those skilled in the art that various changes in form and detail thereof may be made without departing from the spirit and the scope of the invention. For example, a power supply 112 that simulates direct current, such as one having an LCR circuit or other rectifying means, may be used in place of a D.C. power supply. In another example, FIG. 4 shows a magnetic field generator 74 having a plurality of magnets 94 and a holder 96. The annular magnet 88 shown in FIG. 2 may be used in place of the plurality of magnets 94 and holder 96.

We claim:

1. An apparatus for applying material by cathodic arc vapor deposition to substrates, said apparatus comprising:

a vessel;

means for maintaining a vacuum in said vessel;

an annular cathode, having a first end surface, a second end surface, an evaporative surface, and a bore, wherein said bore and said evaporative surface extend between said first and second end surfaces, wherein said annular cathode is disposed radially inside of, and aligned with the substrates;

means for selectively sustaining an arc of electrical energy between said cathode and an anode;

a contactor having a head that is positioned inside said vessel and a shaft attached to said head, said shaft extending from said head to outside said vessel, wherein said contactor is electrically connected to said means for selectively sustaining an arc of electrical energy, and wherein said contactor head can be selectively actuated into said cathode bore, thereby electrically connecting said cathode and said contactor; and a magnetic field generator positioned within said contactor head, wherein said magnetic field generator produces one or more magnetic fields that run substantially parallel to said evaporative surface;

wherein said arc of electrical energy extending between said cathode and said anode liberates a portion of said cathode which is subsequently deposited on the substrate located radially outside said cathode.

2. An apparatus according to claim 1, wherein said magnetic field generator comprises an annular magnet substantially aligned with an axial midpoint of said annular cathode.

3. An apparatus according to claim 1, wherein said magnetic field generator comprises a plurality of magnets circumferentially distributed around a ferromagnetic centerpiece, wherein an axial centerline of each said magnet substantially aligns with an axial midpoint of said annular cathode.

4. An apparatus according to claim 1, wherein said contactor further comprises means for cooling said shaft and said head, thereby providing indirect cooling of said cathode.

* * * * *